US 6,509,131 B2

(12) United States Patent
Hare et al.

(10) Patent No.: US 6,509,131 B2
(45) Date of Patent: *Jan. 21, 2003

(54) IMAGING TRANSFER SYSTEM

(75) Inventors: Donald S. Hare, Hawley, PA (US); Scott A. Williams, Hawley, PA (US)

(73) Assignee: Foto-Wear, Inc., Milford, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/904,660

(22) Filed: Jul. 16, 2001

(65) Prior Publication Data

US 2002/0055056 A1 May 9, 2002

Related U.S. Application Data

(62) Division of application No. 09/191,373, filed on Nov. 13, 1998, now Pat. No. 6,294,307.
(60) Provisional application No. 60/065,806, filed on Nov. 14, 1997.

(51) Int. Cl.$^7$ .............................................. G03C 11/12

(52) U.S. Cl. ....................... 430/138; 430/235; 430/256

(58) Field of Search ................................ 430/138, 256, 430/235

(56) References Cited

U.S. PATENT DOCUMENTS

| 3,222,419 A | 12/1965 | Jubilee et al. |
| 3,257,478 A | 6/1966 | Jubilee et al. |
| 3,658,570 A | 4/1972 | Crooks et al. |
| 3,936,542 A | 2/1976 | Cox |
| 4,021,591 A | 5/1977 | DeVries et al. |
| 4,189,395 A | 2/1980 | Bland |

(List continued on next page.)

FOREIGN PATENT DOCUMENTS

| EP | 0728801 A2 | 8/1996 |
| EP | 0820874 A1 | 1/1998 |
| GB | 2202641 A | 9/1988 |
| JP | 503587 | 3/1988 |

(List continued on next page.)

OTHER PUBLICATIONS

English abstract of JP 59210978 (Nov. 29, 1984).
English abstract of JP 8324106 (Dec. 10, 1996).
English abstract of JP 2147291 (Jun. 6, 1990).
English abstract of JP 55135853 (Oct. 23, 1980).
English abstract of JP 0948974 (Sep. 22, 1997).

*Primary Examiner*—Janet Baxter
*Assistant Examiner*—Amanda C. Walke
(74) *Attorney, Agent, or Firm*—Birch, Stewart, Kolasch & Birch, LLP

(57) ABSTRACT

The present invention relates to an imaging element, which comprises:

a support having a front and rear surface;

a transfer layer having a melting point of at least 65° C. and which is capable of transferring and adhering developed image and non-image areas from said front surface of said support upon the application of heat energy to the rear surface of the support, the transfer layer strips from the front surface of the support by liquefying and releasing from the support when heated, said liquefied transfer layer providing adherence to a receptor element by flowing onto the receptor element and solidifying thereon, the adherence does not require an external surface adhesive layer; and at least one layer of microcapsules or at least one layer of microcapsules and developer in the same layer or separate layers.

The present invention further relates to a method of transferring a photographic image to a receptor element.

22 Claims, 1 Drawing Sheet

U.S. PATENT DOCUMENTS

| | | |
|---|---|---|
| 4,224,358 A | 9/1980 | Hare |
| 4,235,657 A | 11/1980 | Greenman et al. |
| 4,284,456 A | 8/1981 | Hare |
| 4,337,289 A | 6/1982 | Reed et al. |
| 4,351,871 A | 9/1982 | Lewis et al. |
| 4,477,622 A | 10/1984 | Sanderson et al. |
| 4,555,436 A | 11/1985 | Geurtsen et al. |
| 4,726,979 A | 2/1988 | Chapman |
| 4,773,953 A | 9/1988 | Hare |
| 4,863,781 A | 9/1989 | Kronzer |
| 4,869,957 A | 9/1989 | Vankerckhoven et al. |
| 4,966,815 A | 10/1990 | Hare |
| 4,980,224 A | 12/1990 | Hare |
| 5,019,475 A | 5/1991 | Higashiyama et al. |
| 5,104,719 A | 4/1992 | Kamen et al. |
| 5,139,917 A | 8/1992 | Hare |
| 5,163,247 A | 11/1992 | Weber et al. |
| 5,236,801 A | 8/1993 | Hare |
| 5,242,739 A | 9/1993 | Kronzer et al. |
| 5,242,781 A | 9/1993 | Ohbayashi et al. |
| 5,271,990 A | 12/1993 | Kronzer et al. |
| 5,366,857 A | 11/1994 | Sakai |
| 5,370,132 A | 12/1994 | Weber et al. |
| 5,419,944 A | 5/1995 | Sammis |
| 5,441,056 A | 8/1995 | Weber et al. |
| 5,501,902 A | 3/1996 | Kronzer |
| 5,603,996 A | 2/1997 | Overcash et al. |
| 5,612,168 A | 3/1997 | Ishikawa |
| 5,620,548 A | 4/1997 | Hare |
| 5,665,479 A | 9/1997 | Oez |
| 5,678,247 A | 10/1997 | Vickers |
| 5,741,387 A | 4/1998 | Coleman |
| 5,798,179 A | 8/1998 | Kronzer |
| 5,882,388 A | 3/1999 | Adair et al. |
| 5,925,712 A | 7/1999 | Kronzer |
| 5,948,586 A | 9/1999 | Hare |

FOREIGN PATENT DOCUMENTS

| | | |
|---|---|---|
| JP | 97956 | 6/1994 |
| JP | 3018649 | 9/1995 |
| WO | 87/04393 | 7/1987 |
| WO | 93/21561 | 10/1993 |
| WO | WO 9718090 | 5/1997 |
| WO | WO 9820393 | 5/1998 |
| WO | WO 9821398 | 5/1998 |

IMAGING TRANSFER SYSTEM

This application is a divisional application Ser. No. 09/191,373 filed on Nov. 13, 1998, U.S. Pat. No. 6,294,307, the entire contents of which are hereby incorporated by reference and for which priority is claimed under 35 U.S.C. §120; and this application claims priority of application Ser. No. 60/065,806 filed on Nov. 14, 1997 under 35 U.S.C. §119.

BACKGROUND OF THE INVENTION

1. Field of the Invention

The present invention relates to a transfer system preferably using microcapsule technology, and a method of applying a photographic image to a receptor element. More specifically, the present invention relates to CYCOLOR films or prints having images which are capable of being directly transferred to, for instance, a textile such as a shirt or the like without requiring the use of commercial equipment, such as video cameras, computers, color copiers, home and/or lithographic printers.

2. Description of the Prior Art

Textiles such as shirts (e.g., tee shirts) having a variety of designs thereon have become very popular in recent years. Many shirts are sold with pre-printed designs to suit the tastes of consumers. In addition, many customized tee shirt stores are now in business which permit customers to select designs or decals of their choice. Processes have also been proposed which permit customers to create their own designs on transfer sheets for application to tee shirts by use of a conventional iron, such as described in U.S. Pat. No. 4,244,358 issued Sep. 23, 1980. Furthermore, U.S. Pat. No. 4,773,953 issued Sep. 27, 1988, is directed to a method for utilizing a personal computer, a video camera or the like to create graphics, images, or creative designs on a fabric.

U.S. Pat. No. 5,620,548 is directed to a silver halide photographic transfer element and to a method for transferring an image from the transfer element to a receptor surface. Provisional application No. 60/029,917 requires that the silver halide light sensitive grains are dispersed within a carrier which functions as a transfer layer, and does not have a separate transfer layer. Provisional application No. 60/056,446 requires that the silver halide transfer element has a separate transfer layer. Provisional application No. 60/030,933 relates to a transfer element using CYCOLOR technology, but having no separate transfer layer.

CYCOLOR technology provides full color imaging generally associated with photography. With CYCOLOR technology, for example, a polyester base may be coated with light-sensitive microcapsules called cyliths, which are sensitive to red, green, and blue light. Each cylith resembles a water-filled balloon and is about one-tenth the diameter of a human hair. The cyliths contain a liquid monomer in which is dissolved a light sensitive photoinitiator and a color forming substance called a leuco dye.

The imaging system is exposed to light transmitted through or reflected from an original color image. The resulting latent image resembles the negative used in conventional photography. Exposure to light hardens the cyliths in proportion to the amount of exposure, rendering them resistant to physical rupture. Thus, the latent image is a pattern of hard (exposed) and soft (unexposed) cyliths.

The final image is developed by bringing the cyliths into contact with a sheet of CYCOLOR paper or transparancy. Full color is obtained by mixing three different types of cyliths and coating them on a support. Each of the three types of cyliths contain either a cyan, magneta, or yellow leuco dye, along with photoinhibitors that are sensitive respectively to red, green or blue light. Exposure to red light hardens the capsules containing the cyan dye. Pressure development results in the release of magenta and yellow dyes which mix to form a red image. Exposure to green light controls the magenta dye. Pressure development results in the cyan and yellow dyes mixing to form a green image. Blue light controls the yellow dye. Pressure development results in the mixing of the cyan and magenta dyes to form a blue image. Exposure of all cyliths (white light) results in a non color (white or non-image area) and exposure of none of the cyliths results in black. Any color may be reproduced by controlling the relative proportion of the three dyes.

Applications of CYCOLOR technology include use in color copiers to make color copies, or this technology may be used to create hard copy prints from 35 mm slides. Other applications include use with color computer printers to provide prints from computer systems. CYCOLOR technology also works with digital imaging techniques by providing hard copies of images produced by electronic cameras.

U.S. Pat. No. 4,751,165 discloses an imaging system which provides an imaging sheet and a layer of microcapsules containing a photosensitive composition and a color former. However, the developed image and non-image areas thereof are not capable of being simultaneously transformed to a receptor element.

Accordingly, imaging systems based on photosensitive encapsulates are known. U.S. Pat. No. 3,219,446 by Berman discloses the selected transfer of dye to a capsule sheet. U.S. Pat. No. 3,700,439 by Phillips discloses a photocopy process involving development of capsules without transfer.

U.S. Pat. No. 4,711,032 discloses a thermo-autochrome system, which is a direct thermal full color hardcopy system involving thermal media capable of producing color images with the use of microcapsules.

U.S. Pat. No. 5,139,917 discloses an imaging system wherein the developed image and non-image areas are transferred to a receptor element by a separate transfer coating layer.

Copending Provisional application entitled "Imaging Transfer System and Process For Transferring Light-Fixable Thermal Image To A Receptor Element" by Hare et al., filed Nov. 14, 1997, relates to a thermo-autochrome transfer system.

SUMMARY OF THE INVENTION

Accordingly, the present invention is directed to an imaging system which comprises, a support having a front and rear surface, the transfer layer of the invention, and at least one layer of (e.g. photosensitive) microcapsules, or at least one layer of (e.g. photosensitive) microcapsules and developer in the same layer, or at least one layer of (e.g. photosensitive) microcapsules and developer in separate layers, coated on the transfer layer of the invention which has a melting point of at least 65° C., preferably at least 100° C., and which is capable of transferring and adhering developed image and non-image areas from said front surface of said support upon the application of heat energy to the rear surface of the support, said transfer layer strips from said front surface of the support by liquefying and releasing from said support when heated, said liquefied transfer layer providing adherence to a receptor element by flowing onto said receptor element and solidifying thereon, said adherence does not require an external adhesive layer and preferably occurs in an area at least coextensive with the area of said microcapsules. The particle size of the transfer material is from 1 to 50 micrometers, preferably 2 to 50 micrometers, and more preferably 1 to 20 micrometers.

The receptor surface for the image may be a textile such as a shirt (e.g. tee shirt) or the like. Other suitable receptor surfaces include canvas, paper, glass, plastics, ceramics or receptor supports used by the museum or conservatory industry.

The transfer layer of the invention does not contain said microcapsules, and is most preferably between the support and the microcapsule-containing imaging layer(s).

The present invention also relates to a method of applying an image to a receptor element, which comprises the steps of:

(a) exposing imagewise an image sheet of the invention having a front surface and a rear surface, which comprises, a support having a front and rear surface, the transfer layer of the invention, and at least one layer of (e.g. photosensitive) microcapsules, or at least one layer of (e.g. photosensitive) microcapsules and developer in the same layer, or at least one layer of (e.g. photosensitive) microcapsules and developer in separate layers, said transfer layer capable of transferring and adhering developed image and non-image areas from said front surface of said support upon the application of heat energy to the rear surface of the support, said transfer layer strips from said front surface of the support by liquefying and releasing from said support when heated, said liquefied transfer layer providing adherence to a receptor element by flowing onto said receptor element and solidifying thereon, said adherence does not require an external adhesive layer and preferably occurs in an area at least coextensive with said microcapsules;

(b) developing the imagewise exposed element to form an image;

(c) positioning the front surface of said element against said receptor element; and (d) applying energy (e.g. heat) to the rear surface of the element to transfer said photographic image to said receptor element.

The receptor element may be textile, leather, ceramic, wool, glass or plastic. Preferably, the receptor element is a shirt or the like. Energy applied to the rear surface of the imaging system is heat and/or pressure (e.g. via ironing).

BRIEF DESCRIPTION OF THE DRAWINGS

The present invention will become more fully understood from the detailed description given hereinbelow, and the accompanying drawings which are given by way of illustration only, and thus are not limitative of the present invention, and wherein:

FIG. 2 illustrates the step of ironing the transfer element onto a tee shirt or the like.

DETAILED DESCRIPTION OF THE INVENTION

Figure 1:
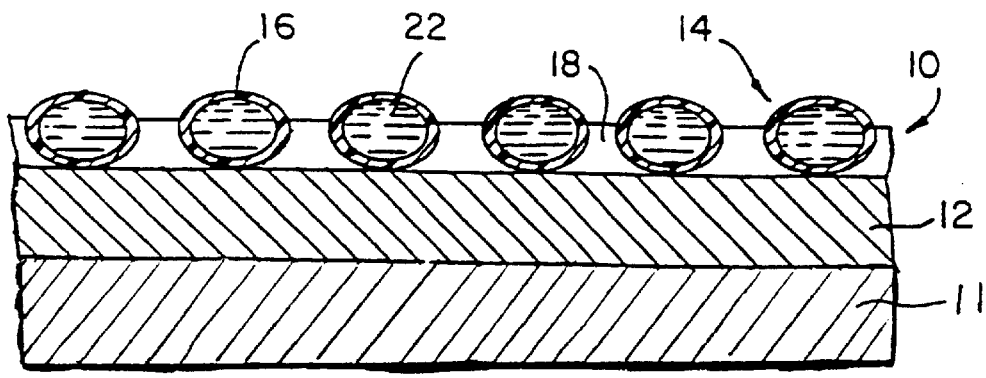
FIG. 1 is a cross-sectional view of the preferred embodiment of an imaging sheet or element of the present invention.

The term "encapsulated" refers to both so-called resin dispersion or open phase systems in which the internal phase containing a chromogenic material is dispersed as droplets throughout a dispersing medium (e.g. conventional binder) and systems in which the capsule is formed with a discrete capsular wall, the latter encapsulation typically being in the form of microcapsule. The term "microcapsule" includes both microcapsules having discrete walls and microcapsules within a so-called open phase system comprising a dispersion of the internal phase constituents in a binder. "Pressure rupturable capsules" are, accordingly, considered to exists in either of these "escapulated" systems. Furthermore, while the capsules are described herein as "pressure rupturable" means other than pressure may be used to rupture them (e.g. heat).

The term "actinic radiation" includes the entire electromagnetic spectrum including ultraviolet (U.V.) and infrared (I.R.) radiation.

The (e.g. photosensitive) microcapsules used in the present invention can be prepared as described in U.S. Pat. Nos. 4,751,165; 4,399,209; 4,440,846; 4,842,920; 4,772,530; 4,773,541; 4,482,624; and 4,771,032.

Typically, CYCOLOR copiers/printers utilize a paper containing a vast number of colored microcapsules which, when exposed to varying degrees of energy (e.g. heat, light or pressure) form a color image. In the present invention a transfer layer is coated on the support. As a result of the invention, the transfer layer will release under energy (e.g. heat) and carry the image and non-image areas to the receptor (e.g. textile) in washproof color.

Furthermore, in a further representative use of CYCOLOR technology two sheets of paper are required. A color encapsulated "donor" roll marries a second paper at the point of light/heat. The donor sheet comprises a support and a top coating containing image (e.g. color) forming microcapsules embedded in a (i.e. conventional) carrier, wherein the "latent" image is transferred to a receptor sheet comprising a support, a transfer layer of the invention, and a developer containing layer comprising developer. As a result of the invention, the developed image and non-image areas may then be transferred to a receptor element (e.g. textile).

Therefore, in a single self-contained imaging sheet comprising a support, a transfer layer of the invention, at least one layer of image forming microcapsules, plus optional developer in the same or different layer, and optional layer of clear thermoplastic, the image and non-image areas may be directly transferred to a receptor element (e.g. textile). In a two sheet system, the sheet ultimately containing the developed image should have the transfer layer of the invention so that the image and non-image areas may be directly transferred to the receptor element.

A requirement of a suitable transfer material when it is used is that it adhere strongly to fibrous supports, and optionally to glassy supports.

The transfer layer of the invention must also be capable of transfer from the support and adherence to a receptor element without the requirement of a separate surface adhesive layer. Without being bound by any theory, upon back surface heating of the support, the transfer layer would undergo a solid to solution phase transition resulting in a transfer to the receiving layer. Edge to edge adhesion, to the receiving layer, would occur upon cooling of the transfer layer onto the receiving layer. Upon cooling, an image layer would be completely transferred onto the receiving element. The transfer layer provides mechanical and thermal stability, as well as washability.

The transfer layer should provide a colorfast image (e.g. washproof or wash resistant) when transferred to the receptor surface. That is, upon washing the receptor element (e.g. tee shirt), the image should remain intact on the receptor element.

Suitable transfer layers of the invention are exemplified below. However, it is easy to screen for suitable transfer layers without undue experimentation in view of the performance criteria discussed in this application. For instance, see the Examples discussed below for suitable screening protocol. Further, the transfer layer of the invention may be mixed with conventional carriers so long as the amount of conventional carrier does not adversely affect the transfer properties of the transfer layer. The optional, clear thermoplastic protective material of the invention includes, for instance, vinyl resins such as ethylene/vinyl acetate copolymers, resin esters, vinyl alcohol/vinyl acetate copolymers, vinyl alkyl ether/maleic anhydride copolymers, polyvinyl chloride, vinyl chloride/vinyl acetate copolymers and the like, acrylic resins such as polyethyl acrylate, polybutyl methacrylate, polymethyl cyanoacrylate and the like, styrene resins, polyamide resins and waxes. The selected thermoplastic material should liquefy under heat during transfer and resolidify when cool. This material protects against abrasion and inadvertent exposure to water. When the optional thermoplastic protective layer is employed, said protective layer is exemplified by U.S. Pat. No. 5,661,101.

Suitable transfer layers include compositions comprising materials from U.S. Pat. Nos. 5,501,902, 5,271,990, 5,242,739 and 5,798,179. The contents of U.S. Pat. Nos. 5,501,902, 5,271,990, 5,242,739 and 5,798,179 are herein incorporated by reference. These patents are discussed in turn hereinbelow.

The transfer layer of the present invention may utilize the materials of the second layer of U.S. Pat. No. No. 5,501,902.

The transfer layer preferably includes particles of a thermoplastic polymer having largest dimensions of less than about 50 micrometers, and preferably from about 1 to about 20 micrometers. The particles will more preferably have dimensions of from about 2 to about 10 micrometers. In general, the thermoplastic polymer can be any thermoplastic polymer which meets the criteria set forth herein. Desirably, the powdered thermoplastic polymer will be selected from the group consisting of polyolefins, polyesters, and ethylene-vinyl acetate copolymers.

The transfer layer also includes from about 10 to about 50 weight percent of a film-forming binder, based on the weight of the thermoplastic polymer. Desirably, the amount of binder will be from about 10 to about 30 weight percent. In general, any film-forming binder may be employed which meets the criteria set forth herein. When the transfer layer includes a cationic polymer, a nonionic or cationic dispersion or solution may be employed as the binder. Suitable binders include polyacrylates, polyethylenes, and ethylenevinyl acetate copolymers. The latter are particularly desired because of their stability in the presence of cationic polymers. The binder desirably will be heat softenable at temperatures of about 120° C. or lower.

The basis weight of the transfer layer may vary as desired, but the transfer layer is preferably present in an amount from about 5 to about 30 g/m². Desirably, the basis weight will be from about 10 to about 20 g/m². The transfer layer can be applied to the support, either directly or over another layer, by means well known to those having ordinary skill in the art. For example, the transfer layer may be applied by roll, blade and air-knife coating procedures.

When the imaging sheet or element is intended to be used as a heat-transfer material, the transfer layer will have a melting point of from about 65 to about 180 degrees Celsius. The term "melts" and variations thereof are used herein only in a qualitative sense and are not meant to refer to any particular test procedure. Reference herein to a melting temperature or range is meant only to indicate an approximate temperature or range at which a polymer or binder melts and flows under the conditions of a melt-transfer process to result in a substantially smooth film.

Manufacturers' published data regarding the melt behavior of polymers or binders correlate with the melting requirements described herein. It should be noted, however, that either a true melting point or a softening point may be given, depending on the nature of the material. For example, materials such as polyolefins and waxes, being composed mainly of linear polymeric molecules, generally melt over a relatively narrow temperature range since they are somewhat crystalline below the melting point.

Melting points, if not provided by the manufacturer, are readily determined by known methods such as differential scanning calorimetry. Many polymers, and especially copolymers, are amorphous because of branching in the polymer chains or the side-chain constituents. These materials begin to soften and flow more gradually as the temperature is increased. It is believed that the ring and ball softening point of such materials, as determined by ASTM E-28, is useful in predicting their behavior. Moreover, the melting points or softening points described are better indicators of performance than the chemical nature of the polymer or binder.

The heat-transfer layer of the invention desirably also will contain from about 2 to about 20 weight percent of a cationic polymer, based on the weight of the thermoplastic polymer. The cationic polymer may be, for example, an amide-epichlorohydrin polymer, polyacrylamides with cationic functional groups, polyethyleneimines, polydiallylamines, and the like. When a cationic polymer is present, a compatible binder should be selected. The binder desirably will be a nonionic binder, either in the form of a solution or a nonionic or cationic dispersion or emulsion. As is well known in the paper coating art, many commercially available binders have anionically charged particles or polymer molecules. These materials are generally not compatible with the cationic polymer which may be used in the present invention.

One or more other components may be used in the transfer layer. For example, the transfer layer may contain from about 1 to about 20 weight percent of a humectant, based on the weight of the thermoplastic polymer. Desirably, the humectant will be selected from the group consisting of ethylene glycol and poly(ethylene glycol). The poly(ethylene glycol) typically will have a weight average molecular weight of from about 100 to about 40,000. A poly(ethylene glycol) having a weight-average molecular weight of from about 200 to about 800 is particularly useful.

The transfer layer also may contain from about 0.2 to about 10 weight percent of a fluid (e.g. ink) viscosity modifier, based on the weight of the thermoplastic polymer. The viscosity modifier desirably will be a poly(ethylene glycol) having a weight-average molecular weight of from about 100,000 to about 2,000,000. The poly(ethylene glycol) desirably will have a weight-average molecular weight of from about 100,000 to about 600,000.

Other components which may be present in the transfer layer include from about 0.1 to about 5 weight percent of a weak acid and from about 0.5 to about 5 weight percent of a surfactant, both based on the weight of the thermoplastic polymer. A particularly useful weak acid is citric acid. The term "weak acid" is used herein to mean an acid having a dissociation constant less than one (or a negative log of the dissociation constant greater than 1).

The surfactant may be an anionic, a nonionic, or a cationic surfactant. When a cationic polymer is present in the transfer layer, the surfactant should not be an anionic surfactant.

Desirably, the surfactant will be a nonionic or cationic surfactant. However, in the absence of the cationic polymer, an anionic surfactant may be used, if desired. Examples of anionic surfactants include, among others, linear and branched-chain sodium alkylbenzenesulfonates, linear and branched-chain alkyl sulfates, and linear and branched-chain alkyl ethoxy sulfates. Cationic surfactant include, by way of illustration, tallow trimethylammonium chloride. Examples of nonionic surfactants, include, again by way of illustration only, alkyl polyethoxylates, polyethoxylated alkylphenols, fatty acid ethanol amides, complex polymers of ethylene oxide, propylene oxide, and alcohols, and polysiloxane polyethers. More desirably, the surfactant will be a nonionic surfactant.

The imaging sheet or element of the invention may have a release layer or a melt-transfer layer located above the support and below the microcapsule containing layer(s). Such a melt-transfer film layer typically comprises a film forming binder, as already described, or other polymer. The layer desirably is applied by extrusion coating, but other methods also may be used. The melt-transfer film layer desirably is formed from a polyethylene or a copolymer of ethylene with acrylic acid, methacrylic acid, vinyl acetate, or acrylic acid esters such as ethyl acrylate. The polymer desirably will have a melt flow rate of at least about 30 grams per 10 minutes (g/10 minutes), as determined in accordance with ASTM Method D-1238, although the melt flow rate may be as high as about 4,000 g/10 minutes. More desirably, the melt flow rate of the polymer will be from about 300 to about 700 g/10 minutes. The basis weight of the melt-transfer film layer desirably will be from about 10 to about 50 grams per square meter (g/m$^2$), with a basis weight of from about 30 to about 50 being more desired.

A release layer may be included, either in place of or in addition to the melt-transfer film layer. In the former instance, the release layer will be placed above the support and below the microcapsule containing layer(s). In the preferred latter instance, the release layer will be placed between the support and the melt-transfer film layer. The release layer desirably will be a low molecular weight ethylene-acrylic acid copolymer applied from an aqueous dispersion. The melt flow rate of the ethylene-acrylic acid copolymer desirably will be at least about 200 g/10 minutes, more desirably from about 800 to about 1,200 g/10 minutes. Such dispersion also may contain a paraffin wax, which is mixed as an emulsion with the ethylene-acrylic acid copolymer dispersion. The paraffin wax emulsion can be any of those which are commercially available, such as Chemwax®40 (Chematron, Inc., Charlotte, N.C.). The ratio of paraffin wax to the copolymer may vary from 0 to about 4, with a ratio of about 1 being more desirable. The basis weight of the release layer desirably will be from about 2 to about 20 g/m$^2$, more desirably from about 6 to about 10 g/m$^2$. The release coating as described melts easily and provides easy release from the first layer for hand ironing of images onto a fabric; such characteristic is especially useful if heating of the image is irregular, which is not atypical of hand-ironing techniques.

The various layers of the material are formed by known coating techniques, such as by curtain coating, Meyer rod, an air knife, and gravure coating procedures. The resulting material, then is dried by means of, for example, steam-heated drums, air impingement, radiant heating, or some combination thereof, or by other methods known in the art. Some care must be exercised, however, to assure that drying temperatures are sufficiently low so that the particles of thermoplastic polymer present in the transfer layer do not melt during the drying process.

Heat transfer of an image in the material of the present invention may be by any known means, such as by a hand-held iron or a heat transfer press. The transfer temperature typically will be from about 120° to about 205° Celsius, for from about 5 seconds to about 2 minutes.

Accordingly, the transfer layer of the invention may comprise particles of a thermoplastic polymer preferably having largest dimensions of less than about 50 micrometers, preferably from about 1 to about 20 micrometers, and more preferably from about 2 to about 10 micrometers, from about 10 to about 50 weight percent of a film-forming binder, based on the weight of the thermoplastic polymer, and from about 0.2 to about 10 weight percent of a viscosity modifier, based on the weight of the thermoplastic polymer.

The transfer layer has a melting point of more than 65° C., preferably more than 100° C. and more preferably from about 100 to about 180 degrees Celsius. The transfer layer may also contain from about 2 to about 20 weight percent of a cationic polymer, based on the weight of the thermoplastic polymer. The transfer layer may also contain from about 1 to about 20 weight percent of a humectant, based on the weight of the thermoplastic polymer. The humectant may be (1) ethylene glycol or (2) polyethylene glycol (e.g. having a weight-average molecular weight of from about 100 to about 40,000, preferably about 200 to about 800).

The viscosity modifier may be a polyethylene glycol having a weight average molecular weight of from 100,000 to about 2,000,000, preferably from about 100,000 to about 600,000. The viscosity modifier may be low or high viscosity methyl cellulose or polyvinyl alcohol.

The transfer layer may also include about 0.1 to about 5 weight percent of a weak acid, based on the weight of the thermoplastic polymer. The transfer layer may also include about 0.5 to about 5 weight percent of a surfactant (e.g. nonionic or cationic), based on the weight of the thermoplastic polymer.

A release layer is optionally interposed between the support and the transfer layer of the invention.

The transfer preferably melts above 100° C., more preferably, from about 100 to about 180° C. and may comprise particles of a thermoplastic polymer having dimensions of about 1 to about 50 micrometers, preferably 1 to 20 micrometers, and more preferably from about 2 to about 10 micrometers, from about 10 to about 50 weight percent of a film-forming binder, based on the thermoplastic polymer, and from about 2 to about 20 weight percent of a cationic polymer, based on the weight of the thermoplastic polymer.

The transfer layer may further comprise from about 1 to about 20 weight percent of a humectant, based on the weight of the thermoplastic polymer (and optionally from about 0.2 to about 10 weight percent of a fluid (e.g. ink) viscosity modifier, based on the weight of the thermoplastic polymer), and from 0.5 to about 5 weight percent of a surfactant, based on the weight of the thermoplastic polymer.

The transfer layer of the present invention may also utilize the materials of the image receptive melt-transfer film layer of U.S. Pat. No. 5,271,990.

The transfer layer may be comprised of a thermoplastic polymer which melts at above 65° C., preferably above 100° C., and more preferably in the range of from about 100 to about 180 degrees Celsius(°C.). In another embodiment, the thermoplastic polymer melts in the range of from about 80° C. to 120° C., preferably from 100° C. to about 120° C.

The nature of the thermoplastic polymer is not known to be critical, but generally it should be inert (e.g. not adversely affecting the properties relating to the image). That is, any known thermoplastic polymer can employed so long as it meets the criteria specified herein. Preferably, the thermoplastic polymer is selected from the group consisting of polyolefins, polyesters, and ethylene-vinyl acetate copolymers, having a particle size of less than 50 micrometers, preferably having a particle size of less than 20, and more preferably less than 10 micrometers.

If desired, as already noted, the material containing the transfer layer of the invention may optionally comprise a melt-transfer film layer and an image receptive film layer as defined in U.S. Pat. No. 5,271,990. In this instance, the melt-transfer film layer overlays the top surface of the base sheet and the image receptive film layer overlays the melt-transfer layer.

In general, the melt-transfer layer is comprised of a first thermoplastic polymer and the image receptive layer is comprised of a second thermoplastic polymer, each of which melts above 65° C., preferably above 100° C., and more preferably in the range of from about 100° C. to about 180° C. Preferably, the first thermoplastic polymer is selected from the group consisting of polyolefins, polyesters, ethylene-vinyl acetate copolymers, ethylene-methacrylic acid copolymers, and ethylene-acrylic acid copolymers. In addition, the second thermoplastic polymer preferably is selected from the group consisting of polyolefins, polyesters, and ethylene-vinyl acetate copolymers.

The term "melts" and variations thereof are used herein only in a qualitative sense and are not meant to refer to any particular test procedure. Reference herein to a melting temperature or range is meant only to indicate an approximate temperature or range at which a thermoplastic polymer melts and flows under film forming conditions to result in a substantially smooth film.

Accordingly, the transfer layer may comprise a thermoplastic polymer selected from the group consisting of polyolefins, polyesters, and ethylene-vinyl acetate copolymers and which melts above 65° C., and preferably above 100° C., and more preferably in the range of from about 100 to about 180 degrees Celsius, and most preferably in the range of about 100 to about 120 degrees Celsius.

An example of the transfer layer of the invention is produced by coextruding a 25 micrometer film of Elvax 3200 and a 19 micrometer film of Surlyn 1702 as described in Example 1 of U.S. Pat. No. 5,271,990. Elvax 3200 is supplied by E. I. Du Pont de Nemours & Company, Inc., Polymer Products Department, Ethylene Polymers Division, Wilmington, Del. Elvax 3200 is an ethylene-vinyl acetate copolymer containing approximately 25% vinyl acetate and modified with wax. It has a melt index of 32 g/10 minutes. Surlyn 1702 also supplied by DuPont. Surlyn 1702 is an ionomer consisting of a cross-linked ethylene-methacrylic acid copolymer having a melt index of 14 g/10 minutes.

The transfer layer of the present invention may also utilize the materials of the image-receptive melt-transfer film layer of U.S. Pat. No. 5,242,739.

The transfer layer may comprise from about 15 to about 80 percent by weight of a film-forming binder selected from the group consisting of ethylene-acrylic acid copolymers, polyolefins, and waxes and from about 85 to about 20 percent by weight of a powdered thermoplastic polymer selected from the group consisting of polyolefins, polyesters, polyamides, waxes, epoxy polymers, ethylene-acrylic acid copolymers, and ethylene-vinyl acetate copolymers, wherein each of said film-forming binder and said powdered thermoplastic polymer melts above about 65° C., preferably above about 100° C., and more preferably in the range of from about 100 to about 180° C., and said powdered thermoplastic is preferably of particles which are from about 1 to about 50 micrometers in diameter, preferably about 2 to 50, and more preferably 1 to about 20 micrometers in diameter.

Thus, the transfer layer comprises from about 15 to about 80 percent by weight of a film-forming binder and from about 85 to about 20 percent by weight of a powdered thermoplastic polymer. Each of the film-forming binders and powdered thermoplastic polymers melt above 65° C., preferably above 100° C., and more preferably in the range of from about 100° C. to about 180° C. In addition, the powdered thermoplastic polymer is preferably composed of particles having diameters of about 50 micrometers, more preferably from about 2 to 50 micrometers, and most preferably from about 1 to about 20 micrometers.

In other embodiments, each of the film-forming binders and powered thermoplastic polymers melt in the range from 80° C. to above 120° C., preferably in the range of from about 100° C. to about 120° C.

The function of the powdered thermoplastic polymer is to assist in the transferring of an image to a fabric, both in terms of ease of transfer and the permanence of the transferred image.

The nature of the film-forming binder is not known to be critical. That is, any film-forming binder can be employed so long as it meets the criteria specified herein. In preferred embodiments, the film-forming binder has, at the transfer temperature, a lower melt viscosity than the powdered thermoplastic polymer. As a practical matter, water-dispersible ethylene-acrylic acid copolymers have been found to be especially effective film forming binders.

In general, the powdered thermoplastic polymer can be any thermoplastic polymer which meets the criteria set forth herein. Preferably, the powdered thermoplastic polymer is selected from the group consisting of polyolefins, polyesters, and ethylene-vinyl acetate copolymers.

The powdered thermoplastic polymer flow partially into the fiber matrix of the fabric to which an image is being transferred. The result is a fabric having an image which does not render the fabric stiff. Moreover, the image itself is neither rubbery nor rough to the feel and is stable to repeated washings.

The melt-transfer film layer comprises a film-forming binder as already described. The image-receptive film layer preferably comprises from about 15 to about 80 percent by weight of a film-forming binder (e.g. ethylene-acrylic acid copolymers; polyolefins and waxes which melt in the range of about 65 to about 180 degrees Celsius). The melt transfer layer may also contain from about 85 to about 20 percent by weight of a powdered thermoplastic polymer, each of which are as already defined.

As a general rule, the amount of powdered thermoplastic polymer employed can be reduced if larger particle sizes are employed.

If desired, any of the foregoing film layers can contain other materials, such as processing aids, release agents, pigments, deglossing agents, antifoam agents, and the like. The use of these and other like materials is well known to those having ordinary skill in the art.

Representative binders and powdered thermoplastic polymers are as follows:

Binder A

Binder A is Michem® 58035, supplied by Michelman, Inc., Cincinnati, Ohio. This is a 35 percent solids dispersion of Allied Chemical's AC 580, which is approximately 10 percent acrylic acid and 90 percent ethylene. The polymer reportedly has a softening point of 102° C. and a Brookfield viscosity of 0.65 pa s (650 centipoise) at 140° C.

Binder B

This binder is Michem® Prime 4983R (Michelman, Inc., Cincinnati, Ohio). The binder is a 25 percent solids dispersion of Primacor® 5983 made by Dow Chemical Company. The polymer contains 20 percent acrylic acid and 80 percent ethylene. The copolymer has a Vicat softening point of 43° C. and a ring and ball softening point of 100° C. The melt index of the copolymer is 500 g/10 minutes (determined in accordance with ASTM D-1238).

Binder C

Binder C is Michem® 4990 (Michelman, Inc., Cincinnati, Ohio). The material is 35 percent solids dispersion of Primacor® 5990 made by Dow Chemical Company. Primacor® 5990 is a copolymer of 20 percent acrylic acid and 80 percent ethylene. It is similar to Primacor® 5983 (see Binder B), except that the ring and ball softening point is 93° C. The copolymer has a melt index of 1,300 g/10 minutes and Vicat softening point of 39° C.

Binder D

This binder is Michem® 37140, a 40 percent solids dispersion of a Hoechst-Celanese high density polyethylene. The polymer is reported to have a melting point of 100° C.

Binder E

This binder is Michem® 32535 which is an emulsion of Allied Chemical Company's AC-325, a high density polyethylene. The melting point of the polymer is about 138° C. Michem® 32535 is supplied by Michelman, Inc., Cincinnati, Ohio.

Binder F

Binder F is Michem® 48040, an emulsion of an Eastman Chemical Company microcrystalline wax having a melting point of 88° C. The supplier is Michelman, Inc., Cincinnati, Ohio.

Powdered Thermoplastic Polymer A

This powdered polymer is Microthene® FE 532, an ethylenevinyl acetate copolymer supplied by Quantum Industries, Cincinnati, Ohio. The particle size is reported to be 20 micrometers. The vicat softening point is 75° C. and the melt index is 9 g/10 minutes.

Powdered Thermoplastic Polymer B

Powdered Thermoplastic Polymer B is Aqua Polysilk 19. It is a micronized polyethylene wax containing some polytetrafluoroethylene. The average particle size is 18 micrometers and the melting point of the polymer is 102°–118° C. The material is supplied by Micro Powders, Inc., Scarsdale, N.Y.

Powdered Thermoplastic Polymer C

This material is Microthene® FN-500, a polyethylene powder supplied by USI Chemicals Co., Cincinnati, Ohio. The material has a particle size of 20 micrometers, a Vicat softening point of 83° C., and a melt index of 22 g/10 minutes.

Powdered Thermoplastic Polymer D

This polymer is Aquawax 114, supplied by Micro Powders, Inc., Scarsdale, N.Y. The polymer has a reported melting point of 91°–93° C. and an average particle size of 3.5 micrometers; the maximum particle size is stated to be 13 micrometers.

Powdered Thermoplastic Polymer E

Powdered Thermoplastic Polymer E is Corvel® 23-9030, a clear polyester from the Powder Coatings Group of the Morton Chemical Division, Morton Thiokol, Inc., Reading, Pa.

Powdered Thermoplastic Polymer F

This material is Corvel® natural nylon 20–9001, also supplied by Morton Thiokol, Inc.

Powdered Thermoplastic Polymer G

This polymer powder is Corvel® clear epoxy 13–9020, supplied by Morton Thiokol, Inc.

Powdered Thermoplastic Polymer H

Powdered Thermoplastic Polymer H is AClyn® 246A, which has a melting temperature of about 95° C. as determined by differential scanning calorimetry. The polymer is an ethylene-acrylic acid magnesium ionomer. The material is supplied by Allied-Signal, Inc., Morristown, N.J.

Powdered Thermoplastic Polymer I

This polymer is AC-316A, an oxidized high density polyethylene. The material is supplied by Allied Chemical Company, Morristown, N.J.

Powdered Thermoplastic Polymer J

This polymer is Texture 5380, supplied by Shamrock Technologies, Inc., Newark, N.J. It is powdered polypropylene having a melting point of 165° C. and an average particle size of 40 micrometers.

The binders and thermoplastic polymers may be combined and blended as desired. For example, Binder A (e.g. 80 parts) may be blended with powdered thermoplastic polymer A (e.g. 80 parts) and optionally with a fluorocarbon dispersion such as Zonyl 7040 (e.g. 0.20 parts) obtained from duPont. Another example includes combining Binder B (e.g. 400 parts) and Polymer B (e.g. 70 parts) and blending in a standard laboratory colloid mill. Also, Binder A (e.g. 286 parts) may be combined with Polymer C (e.g. 65 parts). Binder B (e.g. 400 parts) may be combined with Polymer D (e.g. 70 parts). Binder C (e.g. 200 parts) may be combined with Polymer E (e.g. 35 parts) and optionally with propylene glycol (e.g. 20 parts) and water (e.g. 20 parts). Similarly, Binder C (e.g. 200 parts) may be combined with Polymer F (e.g. 54 parts) and optionally with propylene glycol (e.g. 20 parts) and water (e.g. 20 parts). Also, Binder A (e.g. 200 parts) may be combined with Polymer G (e.g. 30 parts) and optionally with propylene glycol (e.g. 20 parts) and water (e.g. 20 parts). Binder D (e.g. 200 parts) may be combined with Polymer H (e.g. 30 parts) and optionally water (e.g. 40 parts) and blended. Binder A (e.g. 286 parts) may be combined with Polymer J (e.g. 40 parts) and optionally with propylene glycol (e.g. 50 parts).

The transfer layer is present in sufficient quantity so as to provide a colorfast image when transferred to the receptor surface and to provide for the desired transfer. More specifically, the transfer layer of the invention may be preferably present in an amount of at least 50% by coating weight based on the total weight of the layers present in the imaging element (excluding support).

Therefore, if two layers are present, the transfer layer may be present in an amount of 50% by weight based on the total weight of the two layers. If three layers are present, the transfer layer may be present in an amount of 50% by weight based on the total weight of the three layers, and so on.

In an alternative embodiment of the present invention, the "cold-peel" transfer system of U.S. Pat. No. 5,798,179 is used. In this embodiment, the at least one layer of microcapsules, or the at least one layer of microcapsules and developer in the same layer, or the at least one layer of microcapsules and developer in separate layers, or a layer of microparticles, etc. is coated over the third layer (i.e. which overcoats the second layer) which layers are disclosed in U.S. Pat. No. 5,798,179.

Referring to FIG. 1, there is generally illustrated a cross-sectional view of the image sheet 10 of the present invention. The photosensitive layer 14 includes photosensitive microcapsules 16, or cyliths, and a developer resin (e.g. phenolic) 18. Each cylith resembles a water-filled balloon and is about one-tenth the size of a human hair. The cyliths contain a liquid monomer 22 in which is dissolved a light sensitive photoinhibitor and a color forming substance called a leuco dye. The microcapsules 16 and developer resin 18 do not need to be coated in the same layer, but can be coated in contiguous layers with the microcapsules underlying or overlying a layer of the developer resin. The developer layer 18 is not necessarily a film but may consist of finely divided dispersion particles. Similarly, developer layer 18 is not necessarily contiguous but may be interrupted by pores or capillaries.

The imaging sheet 10 comprises a suitable support or substrate 11 which may be any type of material ordinarily used as a support for imaging materials. Examples thereof include cellulose acetate films, cellulose acetate propionate films, cellulose nitrate films, cellulose acetate butyrate films, polyethylene terephthalate films, polystyrene films, polycarbonate films, and laminated sheets of these films and papers. Suitable papers include papers coated with a polymer of an alpha olefin and preferably an alpha olefin having 2 to 10 carbon atoms, such as polyethylene, polypropylene, etc., and baryta coated papers, etc. The only limitation on the support is that it must separate from the transfer layer 12 upon application of heat. If conventional polyolefin paper interferes with transfer due to poor separation from the transfer layer, fiber based paper which does not contain a resin coated layer nearest the support layer or on both surfaces is preferably used.

Figure 2:
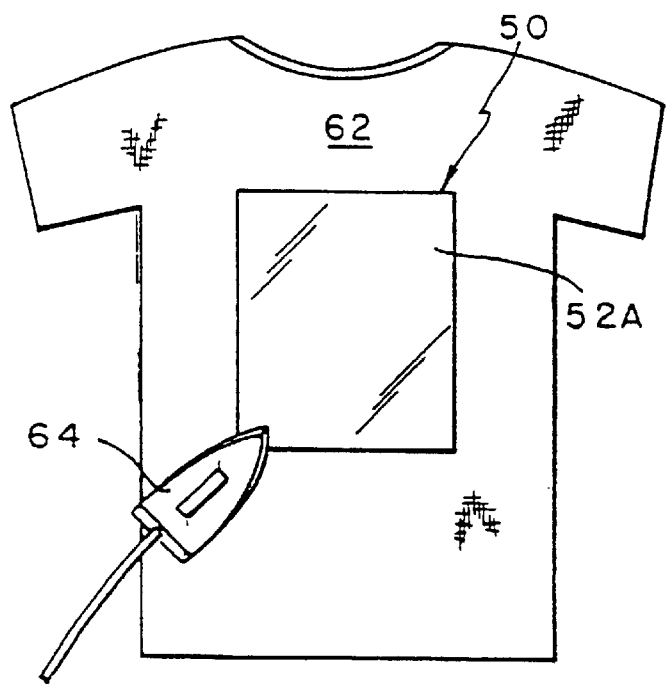

Techniques for exposing and developing the above-described imaging sheet 10 are known in the art (see FIG. 2 of U.S. Pat. No. 4,751,165).

Full color imaging systems are described in more detail in U.S. Pat. No. 4,842,976.

Representative developer containing resins include phenolic developer resins, as described in U.S. Pat. No. No. 4,715,165.

The developer-containing resin and microcapsule composition can be coated using conventional coating techniques such a blade coating, roll coating, etc.

The photosensitive microcapsule composition may comprise photohardenable or photosoftenable compositions. Examples of both are provided in U.S. Pat. No. 4,399,209.

In one embodiment of the invention full color images are formed. In this embodiment, the photosensitive layer 14 contains a mixture of microcapsules having distinct wavelength sensitivities and containing cyan, magenta, yellow, and optionally black color formers. See U.S. Pat. Nos. 4,751,165 and 4,842,976. The microcapsules are mixed and coated with a developer-containing resin as described above. If the microcapsules are respectively sensitive to red, green, and blue light, the imaging sheet can be exposed by direct transmission or reflection imaging. In most cases, however, the microcapsules have distinct sensitivities in the ultraviolet spectrum. In this case, color separation or image processing is required to expose the imaging sheet. Using color separations, the imaging sheet is exposed to three distinct bands of ultraviolet radiation through the color separation in order to control the release and transfer of the cyan, magenta, and yellow color formers. Alternatively, a color image is resolved into its red, green, blue, and optionally black components each of which is then respectively electronically translated into radiation to which the photosensitive composition associated with the complimentary color former is sensitive. The exposure device will control three or four distinct bands of radiation which may be emitted from a single radiation source or a plurality of sources. For example, a Dunn or matrix camera may be used to produce electronic signals corresponding to the cyan, magenta, and yellow (and optionally black) images that are desired. This output drives the electronic control means for an exposure device which may include a conventional multiplexer logic package and timing means. The exposure device selectively drives a radiation source to which the microcapsules on the imaging sheet are sensitive and thereby image-wise exposes the imaging sheet. Various imaging apparatus are described in U.S. Pat. No. 4,751,165.

The transfer layer may be coated with the desired microcapsules in a conventional manner by methods known to one of ordinary skill in the art.

One preferred application of this invention is directed to transfer elements capable of producing multicolor dye images. Such a transfer element comprises a support, transfer layer of the present invention, and a plurality of color forming layers coated thereon. The color forming layers include at least one blue recording yellow dye image forming layer, at least one green recording magenta dye image forming layer, and at least one red recording cyan dye image forming layer. Interlayers may be positioned between the color forming layers. Each image forming layer includes at least one microcapsule layer. The interlayers may contain 100% materials of the transfer layer, conventional materials, or a combination thereof.

The transfer layer of the present invention is applicable to any imaging system based on photosensitive encapsulates. Thus, in an imaging system comprising (i) an imaging sheet and developer material carried on said imaging sheet, or (ii) an imaging sheet and a developer carried on a separate developer sheet, the imaging sheet having a layer of an encapsulated radiation curable photosensitive composition, said imaging system capable of forming images by image-wise exposing said imaging sheet to radiation actinic with respect to said photosensitive composition, and rupturing or otherwise dissolving capsules in the presence of said developer material to form an image, wherein the improvement comprises at least one layer of (e.g. photosensitive) microcapsules, or at least one layer of (e.g. photosensitive) microcapsules and developer in the same layer, or at least one layer of microcapsules and developer in separate layers, on said transfer layer, which is coated on said front surface of the support, said transfer layer preferably having a melting point of at least 100° C., and which is capable of transferring and adhering developed image and non-image areas from said front surface of said support upon the application of heat energy to the rear surface of the support, said transfer layer strips from said front surface of the support by liquefying and releasing from said support when heated, said liquefied transfer layer providing adherence to a receptor element by flowing onto said receptor element and solidifying thereon, said adherence does not require an external (e.g. surface) adhesive layer and preferably occurs in an area at least coextensive with the area of said microcapsules, with the proviso that the transfer layer is not capable of reacting (e.g. with a color precursor) to form an image, and an optional layer of clear thermoplastic material. Preferably, the particle size of the carrier is the same or smaller than that of the microcapsules, for example, from 1–20 micrometers.

The present invention further relates to a developer sheet which comprises a support having a front and rear surface, a transfer layer of the invention and a developer material capable of reacting with a color forming substance to form an image dispersed in the developer resin 18 of the invention.

Another embodiment of the present invention is directed to an imaging sheet useful in forming images onto a receptor surface, said sheet comprising: a support having a front and rear surface, the transfer layer of the present invention, a plurality of photosensitive microcapsules and a developer, said microcapsules and said developer being present on the same layer or in contiguous layers on the surface of said transfer layer, said microcapsules containing a color former which is capable of reacting with said developer and forming a visible dye image, said imaging sheet being useful for transferring image and non-image areas onto a receptor surface. In this embodiment, the developer may be a thermoplastic developer-containing resin. Moreover, the microcapsules may contain an internal phase which includes a photosensitive composition which changes in viscosity in response to exposure to actinic radiation.

The present invention is further directed to the photosensitive imaging system and self-contained imaging sheet of U.S. Pat. No. 4,440,846, which further comprises the transfer layer of the present invention.

More specifically, the present invention is directed to a photosensitive imaging system in which images are formed by image-wise reaction of one or more chromogenic materials and a developer, said system comprising:

a substrate or support having front and back surfaces, the transfer layer of the invention coated on said front surface of the substrate, a chromogenic material, a radiation curable composition which undergoes an increase in viscosity upon exposure to actinic radiation, a coating containing said chromogenic material and said radiation curable composition on one of said front and back surfaces, and a developer material capable of reacting with said chromogenic material to form a visible image, said radiation curable composition being encapsulated in rupturable capsules as an internal phase, wherein images are formed by image-wise exposing said coating to actinic radiation and rupturing said capsules in the image areas such that said internal phase is released from said capsules in the image areas and said chromogenic material and said developer react pattern-wise to form an image. The internal phase may be encapsulated in a microcapsule having a discrete capsule wall. The chromogenic material may be encapsulated with said radiation curable composition.

The invention further relates to a self-contained imaging sheet in which images are formed by image-wise reaction of one or more chromogenic materials and a developer material, said sheet comprising:

a substrate or support having a front and back surface, the transfer layer of the invention coated on said front surface of the substrate, a chromogenic material, a radiation curable composition which undergoes an increase in viscosity upon exposure to actinic radiation, a coating containing said chromogenic material and said radiation curable composition coated on the transfer material of the invention on one of said front and back surfaces, a developer material capable of reacting with said chromogenic material to form a visible image codeposited on said substrate with said coating containing said chromogenic material, said radiation curable composition being encapsulated in rupturable capsules as an internal phase, wherein images are formed by image-wise exposing said coated substrate to actinic radiation, and rupturing said capsules in the image areas such that said internal phase is released from said capsules in the image areas and said chromogenic material pattern-wise reacts with said developer material to form an image. The internal phase may be encapsulated in a microcapsule having a discrete capsule wall. The chromogenic material may be encapsulated with said radiation curable composition.

The present invention is also directed to the transfer imaging system of U.S. Pat. No. 4,399,209, which further comprises the transfer layer of the present invention. More specifically, the present invention is directed to a transfer imaging system in which images are formed by image-wise reaction of one or more chromogenic materials and a developer, said system comprising:

an imaging sheet comprising a first substrate, a radiation curable composition which undergoes an increase in viscosity upon exposure to actinic radiation, a coating on one surface of said first substrate comprising said chromogenic material and said radiation curable composition, said radiation curable composition being encapsulated in rupturable capsules as an internal phase, and a developer sheet comprising a second substrate having a front and rear surface, the transfer layer of the invention coated on said front surface of the second substrate, a developer material on said transfer layer on the invention, said developer capable of reacting with said chromogenic material to form an image on the surface of said second substrate, wherein images are formed by image-wise exposing said coating to actinic radiation, and rupturing capsules in the image areas with said coating in facial contact with said developer sheet such that said internal phase is image-wise released from said ruptured capsules and there is image-wise transfer of said chromogenic material to said developer sheet and a patterned image-forming reaction occurs between said chromogenic material and said developer material. The capsule may be a microcapsule having a discrete capsule wall. The chromogenic material may be encapsulated with said radiation curable composition.

Moreover, the invention is directed to the transfer imaging system of U.S. Pat. No. 4,551,407 which further comprises the transfer layer of the present invention. Thus, the present invention relates to a transfer imaging system in which images are formed by image-wise reaction of one or more chromogenic materials and a developer, said system comprising:

an imaging sheet comprising a first substrate, a chromogenic material, a photodepolymerizable composition which undergoes a decrease in viscosity upon exposure to actinic radiation, a coating on one surface of said first substrate comprising said chromogenic material and said photodepolymerizable composition, said photodepolymerizable composition being encapsulated in rupturable capsules as an internal phase, and a developer sheet comprising a second substrate having a front and rear surface, the transfer layer of the invention coated on said front surface of the second substrate, a developer material coated on said transfer layer of the invention, said developer capable of reacting with said chromogenic material to form an image on the surface of said second substrate, wherein images are formed by image-wise exposing said coating to actinic radiation, and rupturing said capsules in the exposed areas with said coating in facial contact with said developer sheet such that said internal phase is image-wise released from said ruptured capsules and there is image-wise transfer of said chromogenic material to said developer sheet and a patterned image-forming reaction occurs between said chromogenic material and said developer material. The capsule may be a microcapsule having a discrete capsule wall. The chromogenic material may be encapsulated with said photodepolymerizable composition.

In addition, the present invention relates to the photosensitive imaging system and self-contained imaging sheet of U.S. Pat. No. 4,536,463, which further comprises the carrier of the present invention. Thus, the present invention relates to a photosensitive imaging system (or, self-contained sheet) in which images are formed by image-wise reaction of one or more chromogenic materials and a developer, said system (or sheet) comprising:

a substrate having front and back surfaces, the transfer layer of the invention coated on said front surface of the support, a chromogenic material, a composition which undergoes a decrease in viscosity upon exposure to actinic radiation, a coating containing said chromogenic material, and said composition on one of said front and back surfaces, and developer material capable of reacting with said chromogenic material to form a visible image, said composition being encapsulated in rupturable capsules as an internal phase, wherein images are formed by image-wise exposing said coating to actinic radiation and rupturing said capsules in the exposed areas and said chromogenic material and said developer react pattern-wise to form an image. The internal phase may be encapsulated in a microcapsule having a discrete capsule wall.

The chromogenic material may be encapsulated with said photosensitive composition.

The invention is further directed to the imaging sheet of U.S. Pat. No. 4,822,714, which further comprises the transfer layer of the present invention. Accordingly, the present invention is directed to an imaging sheet useful in forming images by exposure-controlled, image-wise reaction of a chromogenic material and a developer, said sheet comprising:

a support having a front and rear surface, a transfer layer of the invention coated on said front surface of the support, a layer of microcapsules on said transfer layer of the invention, said microcapsules having discrete capsule walls which encapsulate an internal phase, said internal phase, including a photosensitive composition which undergoes a change in viscosity sufficient to control the release of the internal phase from said microcapsule, a chromogenic material associated with said microcapsule such that, upon image-wise exposing said layer of microcapsules to actinic radiation and subjecting said layer of microcapsules to a uniform rupturing force, said chromogenic material image-wise becomes available for reaction with a developer to form an image.

Furthermore, the invention is directed to the imaging system of U.S. Pat. No. 4,416,966 which further comprises the transfer layer of the present invention. Thus, the present invention is directed to an imaging system comprising:

an imaging sheet and a background dye or a combination of a dye precursor and a dye developer which react to form a background dye, said imaging sheet including:

a support having a front and rear surface, the transfer layer of the invention coated on said front surface of the support, a plurality of capsules in a layer on one surface of said transfer layer of the invention, and an internal phase contained within said capsules comprising a decolorizing agent and a photohardenable or photosoftenable radiation sensitive composition, wherein images can be formed by image-wise exposing said sheet to actinic radiation and rupturing said capsules such that said decolorizing agent is image-wise released from said capsules and reacts with said associated background dye to decolorize it or inhibits, prevents or reverses the color forming reaction of said dye precursor and dye developer to produce a color difference in the form of an image.

The invention is further directed to the imaging material of U.S. Pat. No. 4,788,125 which further comprises the transfer layer of the present invention.

The term "microparticle" is used herein to define a particle formed from an admixture of an image-forming agent and a photosensitive composition containing a depolymerizable polymer. The term "microparticle" is to be distinguished from the term "microcapsule" which is defined in U.S. Pat. Nos. 4,399,209 and 4,440,846 as a capsule having a discrete capsule wall or an encapsulated dispersion of a photosensitive composition in a binder.

Thus, the present invention is directed to an imaging material comprising:

a support having a front and rear surface, the transfer layer of the invention coated on said front surface of the support, and a layer of photosensitive microparticles on one side of the transfer material which is on said transfer layer of the present invention, said microparticles including an image-forming agent and a photosensitive composition containing a polymer which is capable of undergoing cationically-initiated depolymerization and a photoinitiator including a silver halide and an organo silver salt, wherein, after exposing said microparticle to radiation, said microparticles, directly or with additional processing, release said image-forming agent or become permeable to a developer which reacts with said image-forming agent to form a visible image.

The microparticles may comprise a first set of microparticles containing a cyan image-forming material having a first wavelength sensitivity, a second set of microparticles containing a magenta image-forming material having a second wavelength sensitivity, and a third set of microparticles containing a yellow image-forming material having a third wavelength sensitivity, said first, second, and third sensitivities being sufficiently different that upon exposing said imaging material to a first radiation, substantially only said first microparticles release said image-forming material, upon exposing said imaging material to a second radiation different than said first radiation, substantially only said second set of microparticles release said image-forming material, and upon exposing said imaging material to a third radiation different than said first and second radiations, substantially only said third set of microparticles release said image-forming material.

The image-forming agent may be a colored dye or pigment.

The image-forming agent may be a chromogenic material and a developer material associated with said imaging material may be capable of reacting with said chromogenic material and forming a visible image.

The first, second, and third radiation may be respectively red, green and blue light.

Also, the present invention is directed to the color imaging system of U.S. Pat. No. 4,842,976 which further comprises the transfer layer of the present invention. Thus, the present invention is directed to a color imaging system comprising:

an imaging sheet having a front and rear surface, the transfer layer of the invention coated on said front surface of the imaging sheet, and dry developer material carried on said imaging sheet, or an imaging sheet, a separate image receiving developer sheet having a front and rear surface and having said transfer layer of the invention and a dry developer material located on said front surface, said imaging sheet having on the front surface thereof a coating comprising a cyan color precursor, a radiation curable photosensitive composition associated with said cyan color precursor, a magenta color precursor, a radiation curable photosensitive composition associated with said magenta color precursor, a yellow color precursor, and a radiation curable photosensitive composition associated with said yellow color precursor, said radiation curable photosensitive compositions having distinct sensitivities and being encapsulated in pressure rupturable capsules as an internal phase, said capsules having discrete capsule walls, said cyan, magenta and yellow color precursors being soluble in said associated photosensitive compositions or solvents for said color precursors being encapsulated with said associated photosensitive compositions and said color precursors being present in said capsules with said photosensitive compositions or in said discrete walls; said imaging system being capable of forming images by image-wise exposing said imaging sheet to radiation actinic with respect to said photosensitive compositions, and rupturing at least said capsules containing photosensitive compositions unexposed by said actinic radiation in the presence of said developer material to form an image by reaction of said color precursors with said developer material.

The cyan, magenta and yellow color precursors may be encapsulated in pressure rupturable capsules with their associated radiation curable photosensitive compositions.

The following examples are provided for a further understanding of the invention, however, the invention is not to be construed as being limited thereto.

EXAMPLE 1

A transfer element of the present invention is prepared as follows:

A layer of photosensitive microcapsules as described in U.S. application Ser. No.: 755,400 filed Jul. 16, 1985 (U.S. Pat. No. 4,904,645), is coated onto the coated support of Example 1 of U.S. Pat. No. 5,501,902.

The coated sheet is then image-wise exposed through a mask for 5.2 seconds using a fluorescent light source.

The exposed sheet is processed at high pressure with a calendaring roll as described in Example 1 of U.S. Pat. No. 4,751,165.

EXAMPLE 2

Referring to FIG. 2, the method of applying an image to a receptor element will be described. More specifically, FIG. 2 illustrates how the step of heat transfer from the transfer element 50 to a tee shirt or fabric 62 is performed.

The imaging sheet is prepared, exposed and developed to form an image as in Example 1. A receptor element (e.g. a tee shirt 62) is laid flat, as illustrated, on an appropriate support surface, and the front surface of the transfer element 50 is positioned onto the tee shirt. An iron 64 set at its highest heat setting is run and pressed across the back 52A of the transfer element. The image and nonimage areas are transferred to the tee shirt and the support is removed and discarded.

EXAMPLE 3

A paper support which is not coated on both sides with polyethylene is coated with a transfer layer consisting of a mixture of Michem® 58035 and Michem® Prime 4983R. Both materials are available from Michelman, Inc., Cincinnati, Ohio. A ratio of four or five to one of 58035 to 4983R is used. The basis weight of the melt-transfer layer is 8 g/m². Michem® 58035 is a 35 percent solids dispersion of Allied Chemical's AC 580, which is approximately 10 percent acrylic acid and 90 percent ethylene. The polymer reportedly has a softening point of 102° C. and a Brookfield viscosity of 0.65 Pas (650 centipoise) at 140° C. Michem® Prime 4983R is a 25 percent solids dispersion of Primacor®5985 made by Dow Chemical Company. The polymer contains 20 percent acrylic acid and 80 percent ethylene. The copolymer has a Vicat softening point of 43° C. and a ring and ball softening point of 108° C. The melt flow rate of the copolymer is 500 g/10 minutes.

The transfer layer then is coated with a photosensitive microcapsule-containing solution as in Example 1. When the thermoplastic binder and/or the binder are the variables, the cationic polymer in every case is an amide-epichlorohydrin copolymer, namely, either Kymene® 557H or Reten® 204LS, both being supplied by Hercules Inc., Wilmington, Del. The cationic polymer is included at a level of 5 weight percent, based on the weight of the thermoplastic polymer. The transfer layer is dried by heating at 80°–95° C. The basis weight of the transfer layer is 15 g/m².

In general, a minimum amount of binder is used. For example, 10 weight percent of a polyacrylate, Rhoplex® B-15J (Rohm and Haas Company) may be used. Another binder which may be used at the 10 weight percent level is Michem® 58035, described above. The binder must be compatible with the cationic polymer. Two binders which are more compatible with the cationic polymer and which yellow less than the Michem® 58035 are Airflex® 124 and Airflex® 125, both poly(vinyl alcohol) stabilized ethylene-vinyl acetate copolymers. The materials are available from Air Products and Chemicals, Inc., Allentown, Pa.

Several thermoplastic polymers may be used including Microthene® FE 532, an ethylene-vinyl acetate copolymer supplied by Millennium Chemical Incorp., Cincinnati, Ohio. The particle size is reported to average approximately 20 micrometers. The Vicat softening point is 75° C. The melt flow rate of the copolymer is 9 g/10 minutes and it is reported to have a density of 0.928 g/cm³. Another thermoplastic polymer is Microthene® FN 500, a low density polyethylene powder also supplied by USI Chemicals Co. The material has an average particle size of 20 micrometers, a Vicat softening point of 83° C., a melt flow rate of 22 g/10 minutes, and a density of 0.915 g/cm³.

The material is exposed, developed and transferred as in Example 2.

EXAMPLE 4

Example 3 is repeated, but using the following thermoplastic polymers:

Thermoplastic Polymer A

This polymer is Microthene® FE 532.

Thermoplastic Polymer B

This material is Microthene® FN-500.

Thermoplastic Polymer C

Thermoplastic Polymer C is Corvel® 2093. It is a polyester. The average particle size is 20 micrometers, the melting point of the polymer is approximately 80° C., and the melt flow rate is reported to be "high". The material is supplied by Powder Coatings Group of the Morton Chemical Division, Morton Thiokol, Inc., Reading, Pa.

Thermoplastic Polymer D

This polymer is MP 22.

Thermoplastic Polymer E

Thermoplastic Polymer E is MPP 611.

Thermoplastic Polymer F

This material is MPP 635, also a polyethylene supplied by Micro Powders, Inc. The average particle size of the polymer is 5 micrometers, the melting point is reported to be 124, and the melt flow rate is "high".

Thermoplastic Polymer G

This polymer is Accumist® B6, supplied by Allied Chemical Company, Morristown, N.J. The polymer is a polyethylene having a melting point of 126° C. The average particle size of the polymer is 6 micrometers and the melt flow rate is "high".

Thermoplastic Polymer H

Thermoplastic Polymer H is Accumist® B12, also supplied by Allied Chemical Company. The polymer is a high density polyethylene having a melting point of 126° C. The average particle size of the polymer is 12 micrometers.

Thermoplastic Polymer I

This polymer is DPP 714, a polystyrene dispersion supplied by Dow Chemical Company, Midland, Mich.

Thermoplastic Polymer J

This material is Piccotex® LC55R, a styrene-methyl styrene copolymer dispersion supplied by Hercules, Inc.

Thermoplastic K

Thermoplastic Polymer K is DL 256, a polystyrene dispersion also supplied by Dow Chemical Company.

Thermoplastic L

This polymer is BN 4901X, a polystyrene dispersion available from BASF Corporation, Sarnia, Ontario, Canada.

Thermoplastic M

This material is Ropaque®, a polystyrene dispersion supplied by Rohm and Haas Company, Philadelphia, Pa. Four different binders are used:

Binder A

Binder A is Carboset® 514H, a polyacrylate binder dispersed in water, supplied by B. F. Goodrich Company, Cleveland, Ohio.

Binder B

This binder is Rhoplex® B15.

Binder C

Binder C is Michem® 58035.

Binder D

This binder is Marklube® 542, a cationic low density polyethylene emulsion from Ivax Industries, Inc., Rock Hill, S.C.

The composition of the transfer layer is summarized in Table 1 below. In the Table, the "TP" column identifies the thermoplastic polymer by letter, the "Type" column identifies the binder by letter, and basis weights are given in g/m².

TABLE 1

Summary of Transfer layer Composition with Various Thermoplastic Polymers

| TP | Binder Type | Wt. % | Basis Weight |
|---|---|---|---|
| A | A | 10 | 21 |
| A | B | 10 | 23 |
| A | C | 10 | 23 |
| A | C | 20 | 23 |
| B | C | 50 | 31 |
| B | C | 10 | 23 |
| C | C | 10 | 32 |
| D | C | 10 | 30 |
| E | C | 10 | 23 |
| E | C | 12.5 | 28 |
| E | C | 12.5 | 8 |
| E | C | 12.5 | 13 |
| F | C | 10 | 23 |
| F | C | 12.5 | 13 |
| F | C | 18 | 11 |
| F | C | 20 | 13 |
| F | D | 25 | 13 |
| G | C | 18 | 13 |
| H | C | 18 | 13 |
| I | C | 10 | 17 |
| J | C | 10 | 17 |
| K | C | 10 | 8 |
| L | C | 10 | 8 |
| M | C | 10 | 8 |
| M | C | 30 | 8 |
| M | C | 40 | 8 |

EXAMPLE 5

A base sheet of fiber based paper which is not coated with polyethylene on both sides is coated with a low molecular weight polymer film layer, referred to hereinafter as the first layer. The next layer was a film based on a polymer having a higher molecular weight, referred to hereinafter as the second layer. The next layer (on top of the second layer), is the transfer layer consisted mainly of low molecular weight polyethylene wax particles. Finally, the final layer is consisted of microcapsules as described Example 1.

A number of multi-layered samples (including the base sheet) are evaluated. In every case, the transfer layer consisted of 77 weight percent MPP 635 (Thermoplastic Polymer F), 8 weight percent of BN 4901X (Thermoplastic Polymer L), 10 weight percent Michem® 58035 (Binder C), 4 weight percent Reten® 204LS (cationic polymer), and 1 weight percent Triton® X-100, a surfactant, all based on the total weight of the layer. These weights of binder, cationic polymer, and surfactant are equivalent to 12, 5 and 1 weight percent, respectively, based on the weight of thermoplastic polymer.

A preferred sample using this format contains the following:

First layer: The layer consisted of 45 weight percent Michem® 4983 and 55 weight percent Chemawax® 40. The layer is applied as a mixed latex. The basis weight of the layer was 8 g/m².

Second layer: The layer, located adjacent to the paper, consisted of Epolene® C13 which is formed by melt extrusion at a basis weight of 20 g/m². The polymer is a 200 melt flow rate low density polyethylene obtained from Eastman Chemical Products, Inc., Kingsport, Tenn.

Another material which may be used as the second layer and which can be extrusion coated on the paper base sheet is Nucrel® RX 62, supplied by E. I. Du Pont de Nemours and Company, Inc., Wilmington, Del. The polymer is an ethylene-methacrylic acid copolymer having 10 weight percent methacrylic acid and a melt flow rate of around 500 g/10 min.

The material is exposed, developed and transferred as in Example 3.

EXAMPLE 7

This Example evaluates various cationic polymers. Two types of transfer layers are employed, in which the cationic polymer is included as a component. Type A consists of Microthene® FE 532 (Thermoplastic Polymer A), 13 weight percent of Michem® 58035 binder (Binder C), based on the weight of the thermoplastic polymer, 1 weight percent Triton® X-100 surfactant, and the cationic polymer. The basis weight of the layer is 15 g/m². The Type B layer consists of MPP 635 (Thermoplastic Polymer F), 18 weight percent of Michem® 58035 binder (Binder C), based on the weight of the thermoplastic polymer, 1 weight percent Triton® X-100 surfactant, and the cationic polymer. The basis weight of the layer is 13 g/m². When The Type B second layer is employed, a third layer consisting of Michem® 58035 at a basis weight of 17 g/m² is employed, adjacent to the paper support. The various cationic polymers evaluated are as follows:

Cationic Polymer A

Cationic Polymer A is Kymene® 557, an amide-epichlorohydrin copolymer available from Hercules, Inc.

Cationic Polymer B

This polymer is Calgan® 261LV, a quaternary polymer. It is available from Calgon Corporation.

Cationic Polymer C

This material is Corcat® P145. It is a polyethyleneimine supplied by Cordova Chemical Company.

Cationic Polymer D

Cationic Polymer D is Parez® 631NC, a polyacrylamide available from American Cyanamide.

Cationic Polymer E

This material is Betz® 1260. It is obtained from Betz Paperchem, Trevose, Pa.

Cationic Polymer F

This polymer is Reten® 204LS, an amide-epichlorohydrin copolymer available from Hercules, Inc.

Cationic Polymer G

Verona® C-300 from Miles Inc., Pittsburgh, Pa.

Cationic Polymer H

Aquaprox® UP103 from Synthron, Morgantown, N.C.

Cationic Polymer I

Tinofix® EW from Ciba-Geigy Corporation, Hawthorn, N.Y.

Cationic Polymer J

Reactofix® ES from Ivax Industries, Inc.

Cationic Polymer K

Protefix® TS, a cationic carbamide from Synthron.

In the table, the column "CP" Type" identifies the cationic polymer, whereas the column "Type" identifies the type of transfer material employed, as described above.

TABLE 4

Evaluation of Various Cationic Polymers

| CP Type | Amount | Type |
|---------|--------|------|
| A | 2 | A |
| A | 4 | A |
| A | 6 | A |
| B | 2 | A |
| B | 4 | A |
| C | 2 | A |
| C | 4 | A |
| D | 2 | A |
| D | 4 | A |
| E | 2 | A |
| F | 5 | A |
| F | 4 | A |
| F | 8 | A |
| G | 8 | B |
| H | 8 | B |
| I | 8 | B |
| J | 8 | B |
| K | 8 | B |

Microcapsules as described in Example 1 are coated on top of the transfer layer, which is coated on (i) a fiber base paper which is not coated on both sides with polyethylene and (ii) transparent polyacetate film. The material is exposed, developed and transferred as described in Example 2.

EXAMPLE 8

The formulations involving Cationic Polymer F as reported in Example 7 are modified further since yellowing may be encountered when images are heat transferred.

In the experiments, the paper base which is not coated on both sides with polyethylene is extrusion coated with 44 g/m² of Nucrel® RX62, an ethylene-methacrylic acid copolymer having a melt flow rate of 600 g/10 minutes supplied by E. I. Du Pont de Nemours and Co., Inc. The second layer had a basis weight of approximately 13 g/m².

The binder employed in the transfer layer is either Airflex® 124 (Binder E) or Airflex 125® (Binder F). The binder is present at a level of 26 weight percent, based on the weight of the thermoplastic polymer. The cationic polymer used is Reten® 204LS, the humectant is Polyglycol® E200, a poly(ethylene glycol) from Dow Chemical Company having a weight-average molecular weight of about 200; the humectant level is 10 weight percent, based on the weight of the thermoplastic polymer. The surfactant is Triton® X-100 at a level of 3 weight percent, based on the weight of thermoplastic polymer employed. The fluid viscosity modifier is Polyox® N80 at a level of 3 weight percent, also based on the weight of the thermoplastic polymer. The thermoplastic polymers to be evaluated include micropowders MPP 635 and Accumist® A-12, from Micropowders and Allied Chemical Company, respectively. The material is exposed, developed and transferred as described in Example 2.

The experiments are summarized in Table 5. In the table, the "TP" column identifies the thermoplastic polymer by letter (see Example 9), the "WT.-% CP" column identifies the amount of Reten® 204LS employed in the second layer in weight percent, based on the weight of the thermoplastic polymer, and the "WT.-% Acid" column identifies the amount of citric acid included in the transfer layer, in weight-percent based on the weight of the thermoplastic polymer.

TABLE 5

Summary of Cationic Polymer F Formulation Modifications

| Sample | Binder | TP | Parts CP | Wt.-% Acid |
|--------|--------|----|----|------------|
| 1 | F | H | 8 | None |
| 2 | F | H | 8 | 4 |
| 3 | E | H | 8 | None |
| 4 | F | F | 8 | None |
| 5 | F | F | 12 | None |
| 6 | F | F | 16 | None |

EXAMPLE 9

Foto-Wear!, Inc. Print n' Wear paper marketed under the name Print n' Wear (comparative support Substrate A) is directly compared to (inventive support) Substrate B after both are coated with microcapsules as described in Example 1. Substrate A is "TRANSEZE" having a Singapore Dammar Resin coated thereon, and is manufactured by Kimberly-Clark in 1990, and stored under fluctuating temperature and humidity. Substrate B is recently manufactured by Kimberly-Clark under the name Foto-Wear! Jet Wear (Green-Line Hot Peel) and stored under the same conditions.

The papers are processed and transferred as in Example 2.

EXAMPLE 10

A transfer element of the present invention is prepared as follows:

A layer of photosensitive microcapsules as described in U.S. Pat. No. 4,904,605 is coated onto any of the inventive supports disclosed in the Examples of U.S. Pat. No. 5,798,179.

The coated sheet is then exposed and processed as in Example 1 above.

The transfer steps described in U.S. Pat. No. 5,798,179 are then followed.

All cited patents, publications, copending applications, and provisional applications referred to in this application are herein incorporated by reference.

The invention being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method of applying an image to a receptor element which comprises the steps of:

(a) exposing imagewise an imaging system which comprises:

a support having a front and rear surface;

a transfer layer having a melting point of at least 65° C. and comprising (i) particles of a thermoplastic polymer having dimensions of about 1 to about 50 micrometers, from about 10 to about 50 weight percent of a film-forming binder, based on the weight of the thermoplastic polymer, and optionally from about 0.2 to about 10 weight percent of a viscosity modifier, based on the weight of the thermoplastic polymer, (ii) about 15 to about 80 percent by weight of a film-forming binder selected from the group consisting of ethylene-acrylic acid copolymers, polyolefins, and waxes and from about 85 to about 20 percent by weight of a powdered thermoplastic polymer selected from the group consisting of polyolefins, polyesters, polyamides, waxes, epoxy polymers, ethylene-acrylic acid copolymers, and ethylene-vinyl acetate copolymers, wherein each of said film-forming binder and said powdered thermoplastic polymer melts in the range of from about 65° C. to about 180 degrees Celsius, (iii) a film forming binder selected from the group consisting of ethylene-acrylic acid copolymers, polyolefins, and waxes and which melts in the range of from about 65° C. to about 180 degrees Celsius, (iv) a thermoplastic polymer selected from the group consisting of polyolefins, polyesters, and ethylene-vinyl acetate copolymers and which melts in the range of from about 65 to about 180 degrees Celsius or, (v) a thermoplastic polymer having selected from the group consisting of polyolefins, polyesters, and ethylene-vinyl acetate copolymers, ethylene-methacrylic acid copolymers, and ethylene-acrylic acid copolymers and which melts in the range of from about 65 to about 180 degrees Celsius; wherein said transfer layer is capable of transferring and adhering developed image and non-image areas from said front surface of said support upon the application of heat energy to the rear surface of the support, said transfer layer strips from said front surface of the support by liquefying and releasing from said support when heated, said liquefied transfer layer providing adherence to a receptor element by flowing onto said receptor element and solidifying thereon, said adherence does not require an external surface adhesive layer, and at least one layer of microcapsules or at least one layer of microcapsules and developer in the same layer or at least one layer of microcapsules and developer in separate layers coated on said transfer layer, (b) developing the imagewise exposed imaging system to form an image, (c) positioning the front surface of imaging system against said receptor element, and (d) applying energy to the rear surface of the imaging system to transfer said image to said receptor element.

2. The method of claim 1, wherein the imaging system comprises an imaging sheet useful in forming images by exposure-controlled, image-wise reaction of a chromogenic material and a developer, said sheet comprising:

a support having a front and rear surface, said transfer layer on said front surface of the support, at least one layer of microcapsules coated on said transfer layer, said microcapsules having discrete capsule walls which encapsulate an internal phase, said internal phase, including a photosensitive composition which undergoes a change in viscosity sufficient to control the release of the internal phase from said microcapsules, a chromogenic material associated with said microcapsules such that, upon image-wise exposing said layer of microcapsules to actinic radiation and subjecting said layer of microcapsule to a uniform rupturing force, said chromogenic material image-wise becomes available for reaction with a developer to form an image.

3. The method of claim 1, in which images are formed by image-wise reaction of one or more chromogenic materials and a developer, said system comprising:

a substrate having front and back surfaces, said transfer layer on said front surface of the substrate, a chromogenic material, a radiation curable composition which undergoes an increase in viscosity upon exposure to actinic radiation, a coating containing chromogenic material and said radiation curable composition on said transfer layer, and a developer material capable of reacting with said chromogenic material to form a visible image, said radiation curable composition being encapsulated in rupturable capsules as an internal phase, wherein images are formed by image-wise exposing said coating to actinic radiation and rupturing said capsules in the image areas such that said internal phase is released from said capsules in the image areas and said chromogenic material and said developer react patternwise to form an image.

4. The method of claim 1, wherein the transfer layer comprises particles of a thermoplastic polymer having dimensions of 1 to 20 micrometers.

5. The method of claim 1, wherein the transfer layer comprises particles of a thermoplastic polymer having dimensions of about 1 to about 20 micrometers, from about 10 to about 50 weight percent of a film-forming binder, based on the weight of the thermoplastic polymer, and optionally from about 0.2 to about 10 weight percent of a fluid viscosity modifier, based on the weight of the thermoplastic polymer.

6. The method of claim 1, wherein the transfer layer melts from about 65 to about 180 degrees Celsius and comprises particles of a thermoplastic polymer having dimensions of about 1 to about 20 micrometers, from about 10 to about 50 weight percent of a film-forming binder, based on the weight of the thermoplastic polymer, and from about 2 to about 20 weight percent of a cationic polymer, based on the weight of the thermoplastic polymer.

7. The method of claim 1, wherein the transfer layer comprises from about 15 to about 80 percent by weight of a film-forming binder selected from the group consisting of ethylene-acrylic acid copolymers, polyolefins, and waxes and from about 85 to about 20 percent by weight of a powdered thermoplastic polymer selected from the group consisting of polyolefins, polyesters, polyamides, waxes, epoxy polymers, ethylene-acrylic acid copolymers, and ethylene-vinyl acetate copolymers, wherein each of said film-forming binder and said powdered thermoplastic polymer melts in the range of from about 65 to about 180 degrees Celsius and said powdered thermoplastic consists of particles which are from about 1 to about 50 micrometers in diameter.

8. The method of claim 1, wherein the transfer layer comprises a film forming binder selected from the group consisting of ethylene-acrylic acid copolymers having particles of about 1 to 20 micrometers, polyolefins, and waxes and which melts in the range of from about 65 to about 180 degrees Celsius.

9. The method of claim 1, wherein the transfer layer comprises a thermoplastic polymer having particles of about 1 to 20 micrometers selected from the group consisting of polyolefins, polyesters, and ethylene-vinyl acetate copolymers and which melts in the range of from about 65 to about 180 degrees Celsius.

10. The method of claim 1, wherein the transfer layer comprises a thermoplastic polymer having particles of about 1 to 50 micrometers selected from the group consisting of polyolefins, polyesters, and ethylene-vinyl acetate copolymers, ethylene-methacrylic acid copolymers, and ethylene-acrylic acid copolymers and which melts in the range of from about 65 to about 180 degrees Celsius.

11. The method of claim 1, wherein the transfer layer further contains gelatin which is present in such an amount that it does not adversely affect transferring and adhering of said transfer layer onto said receptor element.

12. The method of claim 1, which comprises a self-contained imaging sheet in which images are formed by image-wise reaction of one or more chromogenic materials and a developer material, said sheet comprising:
   a substrate having a front and back surface,
   said transfer layer on said front surface of the substrate,
   a chromogenic material, a radiation curable composition which undergoes an increase in viscosity upon exposure to actinic radiation,
   a coating containing said chromogenic material and said radiation curable composition on one of said front and back surfaces,
   a developer material capable of reacting with said chromogenic material to form a visible image codeposited on said substrate with said coating containing said chromogenic material,
   said radiation curable composition being encapsulated in rupturable capsules as an internal phase,
   wherein images are formed by image-wise exposing said coated substrate to actinic radiation, and rupturing said capsules in the image areas such that said internal phase is released from said capsules in the image areas and said chromogenic material pattern-wise reacts with said developer material to form an image.

13. The method of claim 1, in which images are formed by image-wise reaction of one or more chromogenic materials and a developer, said system comprising:
   an imaging sheet comprising a first substrate,
   a radiation curable composition which undergoes an increase in viscosity upon exposure to actinic radiation,
   a coating on the surface of said transfer layer comprising said chromogenic material and said radiation curable composition,
   said radiation curable composition being encapsulated in rupturable capsules as an internal phase, and
   a developer sheet comprising a second substrate having a front and rear surface,
   said the transfer layer coated on said front surface of the second substrate,
   a developer material dispersed in said carrier on said second substrate, said developer capable of reacting with said chromogenic material to form an image on the surface of said second substrate,
   wherein images are formed by image-wise exposing said coating to actinic radiation, and rupturing capsules in the image areas with said coating in facial contact with said developer sheet such that said internal phase is image-wise released from said internal phase is image-wise released from said ruptured capsules and there is image-wise transfer of said chromogenic material to said developer sheet and a patterned image-forming reaction occurs between said chromogenic material and said developer material.

14. The method of claim 1 in which images are formed by image-wise reaction of one or more chromogenic materials and a developer, said system comprising:
   an imaging sheet comprising a first substrate,
   a chromogenic material,
   a photodepolymerizable composition which undergoes a decrease in viscosity upon exposure to actinic radiation,
   a coating on the transfer layer comprising said chromogenic material and said photodepolymerizable composition,
   said photodepolymerizable composition being encapsulated in rupturable capsules as an internal phase, and
   a developer sheet comprising a second substrate having a front and rear surface,
   said transfer layer coated on said front surface of the second substrate,
   a developer material dispersed in said carrier on said second substrate, said developer capable of reacting with said chromogenic material to form an image on the surface of said second substrate,
   wherein images are formed by image-wise exposing said coating to actinic radiation, and rupturing said capsules in the exposed areas with said coating in facial contact with said developer sheet such that said internal phase is image-wise released from said ruptured capsules and there is image-wise transfer of said chromogenic material to said developer sheet and a patterned image-forming reaction occurs between said chromogenic material and said developer material.

15. The method of claim 1, in which images are formed by image-wise reaction of one or more chromogenic materials and a developer, said system comprising
   a substrate having front and back surfaces,
   said transfer layer on one surface of the first substrate,
   a chromogenic material,
   a composition which undergoes a decrease in viscosity upon exposure to actinic radiation,
   a coating containing said chromogenic material and said composition on one of said front and back surfaces, and
   developer material capable of reacting with said chromogenic material to form a visible image,
   said composition being encapsulated in rupturable capsules as an internal phase,
   wherein images are formed by image-wise exposing said coating to actinic radiation and rupturing said capsules in the exposed areas and said chromogenic material and said developer react pattern-wise to form an image.

16. The method of claim 1, which comprises an imaging sheet useful in forming images onto a receptor surface, said sheet comprising:
   a support having a front and rear surface,
   said transfer layer on said front surface of the support,
   a plurality of photosensitive microcapsules and a developer on the surface of the transfer layer, said microcapsules and said developer being present on the same layer or in contiguous layers on the surface of said transfer layer, said microcapsules containing a color former which is capable of reacting with said developer and forming a visible dye image, said imaging sheet being useful for transferring images and non-image areas onto a receptor surface.

17. The method of claim 1, which comprises:

an imaging sheet and a background dye or a combination of a dye precursor and a dye developer which react to form a background dye, said imaging sheet including:

a support having a front and rear surface, said transfer layer on said front surface of the support, a plurality of capsules dispersed in a layer on said transfer layer, and an internal phase contained within said capsules comprising a decolorizing agent and a photohardenable or photosoftenable radiation sensitive composition, wherein images can be formed by image-wise exposing said sheet to actinic radiation and rupturing said capsules such that said decolorizing agent is image-wise released from said capsules and reacts with said associated background dye to decolorize it or inhibits, prevents or reverses the color forming reaction of said dye precursor and dye developer to produce a color difference in the form of an image.

18. The method of claim 1 comprising:

an imaging sheet having a front and rear surface, and said transfer layer on said front surface of the imaging sheet, and dry developer carried on said imaging sheet, or an imaging sheet, a separate image receiving developer sheet having a front and rear surface and having said transfer material and a dry developer material on said front surface, said imaging sheet having on one surface thereof a coating comprising a cyan color precursor, a radiation curable photosensitive composition associated with said cyan color precursor, a magenta color precursor, a radiation curable photosensitive composition associated with said magenta color precursor, a yellow color precursor, and a radiation curable photosensitive composition associated with said yellow color precursor, said radiation curable photosensitive compositions having distinct sensitivities and being encapsulated in pressure rupturable capsules as an internal phase, said capsules having discrete capsule walls, said cyan, magenta and yellow color precursors being soluble in said associated photosensitive compositions or solvents for said color precursors being encapsulated with said associated photosensitive compositions and said color precursors being present in said capsules with said photosensitive compositions or in said discrete walls;

said imaging system being capable of forming images by image-wise exposing said imaging sheet to radiation actinic with respect to said photosensitive compositions, and rupturing at least said capsules containing photosensitive compositions unexposed by said actinic radiation in the presence of said developer material to form an image by reaction of said color precursors with said developer material.

19. A method of applying an image to a receptor element which comprises the steps of:

(a) exposing imagewise an imaging system which comprises:

a support having a front and rear surface;

a transfer layer having a melting point of at least 65° C. and comprising (i) particles of a thermoplastic polymer having dimensions of about 1 to about 50 micrometers, from about 10 to about 50 weight percent of a film-forming binder, based on the weight of the thermoplastic polymer, and optionally from about 0.2 to about 10 weight percent of a viscosity modifier, based on the weight of the thermoplastic polymer, (ii) about 15 to about 80 percent by weight of a film-forming binder selected from the group consisting of ethylene-acrylic acid copolymers, polyolefins, and waxes and from about 85 to about 20 percent by weight of a powdered thermoplastic polymer selected from the group consisting of polyolefins, polyesters, polyamides, waxes, epoxy polymers, ethylene-acrylic acid copolymers, and ethylene-vinyl acetate copolymers, wherein each of said film-forming binder and said powdered thermoplastic polymer melts in the range of from about 65° C. to about 180 degrees Celsius, (iii) a film forming binder selected from the group consisting of ethylene-acrylic acid copolymers, polyolefins, and waxes and which melts in the range of from about 65° C. to about 180 degrees Celsius, (iv) a thermoplastic polymer selected from the group consisting of polyolefins, polyesters, and ethylene-vinyl acetate copolymers and which melts in the range of from about 65 to about 180 degrees Celsius or, (v) a thermoplastic polymer selected from the group consisting of polyolefins, polyesters, and ethylene-vinyl acetate copolymers, ethylene-methacrylic acid copolymers, and ethylene-acrylic acid copolymers and which melts in the range of from about 65 to about 180 degrees Celsius, wherein said transfer layer is capable of transferring and adhering developed image and non-image areas from said front surface of said support upon the application of heat energy to the rear surface of the support, said transfer layer strips from said front surface of the support by liquefying and releasing from said support when heated, said liquefied transfer layer providing adherence to a receptor element by flowing onto said receptor element and solidifying thereon, said adherence does not require an external surface adhesive layer, and a layer of photosensitive microparticles on one surface of said support, said microparticles including an image-forming agent and a photosensitive composition containing a polymer which is capable of undergoing cationically-initiated depolymerization and photoinitiator including a silver halide and an organo silver salt, wherein after exposing said microparticle to radiation, said microparticles, directly or with additional processing, release said image-forming agent or become permeable to a developer which reacts with said image-forming agent to form a visible image, (b) developing the imagewise exposed imaging system to form an image, (c) positioning the front surface of imaging system against said receptor element, and (d) applying energy to the rear surface of the imaging system to transfer said image to said receptor element.

20. The method of claim 19, wherein said microparticles comprise a first set of microparticles containing a cyan image-forming material having a first wavelength sensitivity, a second set of microparticles containing a magenta image-forming material having a second wavelength sensitivity, and a third set of microparticles containing a yellow image-forming material having a third wavelength sensitivity, said first, second, and third sensitivities being sufficiently different that upon exposing said imaging material to a first radiation, substantially only said first microparticles release said image-forming material, upon exposing said imaging material to a second radiation different than said first radiation, substantially only said second set of microparticles release said image-forming material, and upon exposing said imaging material to a third radiation different than said first and second radiations, substantially only said third set of microparticles release said image-forming material.

21. A method of applying an image to a receptor element which comprises the steps of:

(a) exposing imagewise an imaging element, which comprises:

a support having a front and rear surface;

a transfer layer having a melting point of at least 65° C. and which is capable of transferring and adhering developed image and non-image areas from said front surface of said support upon the application of heat energy to the rear surface of the support, the transfer layer strips from the front surface of the support by liquefying and releasing from the support when heated, said liquefied transfer layer providing adherence to a receptor element by flowing onto the receptor element and solidifying thereon, the adherence does not require an external surface adhesive layer; and at least one layer of microcapsules and developer in the same layer or at least one layer of microcapsules and developer in separate layers coated on said transfer layer, (b) developing the imagewise exposed imaging system to form an image, (c) positioning the front surface of imaging system against said receptor element, and (d) applying energy to the rear surface of the imaging system to transfer said image to said receptor element.

22. The method of claim 21, wherein the receptor element is textile, leather, ceramic, wool, glass, plastic, or metal.

* * * * *